United States Patent
Aoki (10) Patent No.: US 9,647,170 B2
(45) Date of Patent: May 9, 2017

(54) METHOD FOR PRODUCING GROUP III NITRIDE SEMICONDUCTOR LIGHT-EMITTING DEVICE

(71) Applicant: TOYODA GOSEI CO., LTD., Kiyosu-shi (JP)

(72) Inventor: Masato Aoki, Kiyosu (JP)

(73) Assignee: TOYODA GOSEI CO., LTD., Kiyosu-Shi, Aichi-Ken (JP)

( * ) Notice: Subject to any disclaimer, the term of this patent is extended or adjusted under 35 U.S.C. 154(b) by 55 days.

(21) Appl. No.: 14/616,498

(22) Filed: Feb. 6, 2015

(65) Prior Publication Data

US 2015/0236193 A1     Aug. 20, 2015

(30) Foreign Application Priority Data

Feb. 19, 2014   (JP) .................................. 2014-029564

(51) Int. Cl.
*H01L 33/00*   (2010.01)

(52) U.S. Cl.
CPC .................................. *H01L 33/007* (2013.01)

(58) Field of Classification Search
CPC .................................................. H01L 33/0075
See application file for complete search history.

(56) References Cited

U.S. PATENT DOCUMENTS

2012/0112203 A1*   5/2012  Enya .................. B82Y 20/00
                                                       257/76

FOREIGN PATENT DOCUMENTS

| JP | H10-075019 | 3/1998 |
| JP | 2001-015808 | 1/2001 |
| JP | 2001-077417 | 3/2001 |
| JP | 2006-128653 | 5/2006 |
| JP | 2008-028121 | 2/2008 |
| JP | 2008-251641 | 10/2008 |
| JP | 2013-175790 A | 9/2013 |

OTHER PUBLICATIONS

Japanese Office Action dated Dec. 20, 2016, with a partial English translation.
Chinese Office Action dated Jan. 22, 2017, with an English translation.

* cited by examiner

*Primary Examiner* — Caleb Henry
*Assistant Examiner* — Mounir Amer
(74) *Attorney, Agent, or Firm* — McGinn IP Law Group, PLLC (57) ABSTRACT

The present techniques provide a method for producing a Group III nitride semiconductor light-emitting device, with suppression of an increase in polarity inversion defect density. The production method includes an n-type semiconductor layer formation step, a light-emitting layer formation step, and a p-type semiconductor layer formation step. The p-type semiconductor layer formation step includes a p-type cladding layer formation step. The p-type cladding layer formation step includes a first p-type semiconductor layer formation step for forming a p-type AlGaN layer, a first semiconductor layer growth intermission step after the first p-type semiconductor layer formation step, and a p-type InGaN layer formation step after the first semiconductor layer growth intermission step. In the first semiconductor layer growth intermission step, a mixture of nitrogen gas and hydrogen gas is supplied to the substrate.

19 Claims, 4 Drawing Sheets

METHOD FOR PRODUCING GROUP III NITRIDE SEMICONDUCTOR LIGHT-EMITTING DEVICE

BACKGROUND OF THE INVENTION

Field of the Invention

The present techniques relate to a method for producing a Group III nitride semiconductor light-emitting device. More particularly, the techniques relate to a method for producing a Group III nitride semiconductor light-emitting device, which can provide a p-type cladding layer having high crystallinity.

Background Art

Group III nitride semiconductor crystals are produced through vapor phase growth techniques such as metal organic chemical vapor deposition (MOCVD) or hydride vapor phase epitaxy (HVPE); molecular-beam epitaxy (MBE); pulsed sputter deposition (PSD); liquid phase epitaxy (LPE); or a similar technique.

Among these techniques, when semiconductor layers are grown by MOCVD, various gases are fed to an MOCVD furnace, and the semiconductor layer is formed in the atmosphere of the furnace. Patent Document 1 discloses a technique for growth of a semiconductor layer, wherein a nitrogen gas atmosphere and a nitrogen-hydrogen gas mixture atmosphere are selectively employed, depending on the composition of the semiconductor layer to be formed. (see Patent Document 1, paragraph [0107]).

Patent Document 1: Japanese Patent Application Laid-Open (kokai) No. 2013-175790

Meanwhile, polarity inversion defects may be generated in a Group III nitride semiconductor layer during growth thereof. A polarity inversion defect refers to a defect caused by intermingling of an N-plane with a Ga-plane. The number of polarity inversion defects per unit area of a plane orthogonal to the direction of growth of the semiconductor layer is defined as "polarity inversion defect density." The lower the polarity inversion defect density, the higher the crystallinity of the semiconductor layer.

Generally, the polarity inversion defect density increases with the progress of epitaxial growth. In other words, the polarity inversion defect density at the later stage of epitaxial growth is generally higher than that at the initial stage of epitaxial growth. Thus, suppression of an increase in polarity inversion defect density in the course of epitaxial growth is preferable.

In a growth atmosphere containing hydrogen gas, some semiconductor layers may be damaged during growth thereof. Thus, it is preferred that an increase in polarity inversion defect density is suppressed, without degradation of the crystallinity of the semiconductor layer during growth.

SUMMARY OF THE INVENTION

The present techniques have been conceived in order to solve the aforementioned problems. Thus, an object of the present techniques is to provide a method for producing a Group III nitride semiconductor light-emitting device, which suppresses an increase in polarity inversion defect density.

In a first aspect of the present techniques, there is provided a method for producing a Group III nitride semiconductor light-emitting device, the method comprising: (a) forming an n-type semiconductor layer on a substrate; (b) forming a light-emitting layer on the n-type semiconductor layer; and (c) forming a p-type semiconductor layer on the light-emitting layer. The step (c) comprises a step (d) forming a p-type cladding layer, the step (d) comprising: (e) forming a first p-type semiconductor layer; (f) interrupting a semiconductor layer growth after forming the first p-type semiconductor layer; and (g) forming a p-type InGaN layer after the interruption, in the step (f), a mixture of nitrogen gas and hydrogen gas is supplied to the substrate.

In the method for producing a Group III nitride semiconductor light-emitting device, the mixture of nitrogen gas and hydrogen gas is supplied to the substrate, not in the growth phase in which raw material gases for forming a semiconductor layer are supplied but in the intermission phase in which supply of at least one raw material gas is paused. The semiconductor layer can be etched by hydrogen gas. Since bonding strength between atoms is weak in polarity inversion defects, a semiconductor layer having such defects is readily etched. Thus, after growth of the first p-type semiconductor layer, polarity inversion defects present on the surface of the first p-type semiconductor layer are preferentially etched. Thus, after the first intermission phase, polarity inversion defects on the first p-type semiconductor layer decrease to some extent. As a result, in a semiconductor light-emitting device produced through the method, a polarity inversion defect density in the p-type semiconductor layer is lower than that of a conventional semiconductor light-emitting device.

In the production method of the techniques, different carrier gases are employed in the semiconductor layer formation step and the semiconductor layer growth intermission step. Also, hydrogen gas is supplied before formation of the p-type InGaN layer, whereby polarity inversion defects on the surface of the p-type semiconductor layer are decreased. As a result, the p-type InGaN layer receives substantially no damage.

In a second aspect of the present techniques, there is provided a method for producing a Group III nitride semiconductor light-emitting device, the step (d) further comprising: (h) interrupting a semiconductor layer growth after forming the p-type InGaN layer, in the step (h), nitrogen gas is supplied to the substrate, while no hydrogen gas is supplied to the substrate.

In a third aspect of the present techniques, there is provided a method for producing a Group III nitride semiconductor light-emitting device, in the first p-type semiconductor layer formation step and the p-type InGaN layer formation step, nitrogen gas is supplied to the substrate, while no hydrogen gas is supplied to the substrate.

In a fourth aspect of the present techniques, there is provided a method for producing a Group III nitride semiconductor light-emitting device, the ratio of the volume of hydrogen gas to the total volume of nitrogen gas and hydrogen gas of the gas mixture is adjusted to 20% to 100%, in the first intermission step. When the volume ratio falls within the range, low polarity inversion defect density can be attained.

In a fifth aspect of the present techniques, there is provided a method for producing a Group III nitride semiconductor light-emitting device, in the first p-type semiconductor layer formation step, a p-type AlGaN layer or a p-type GaN layer is formed as the first p-type semiconductor layer.

The present techniques enable provision of a method for producing a Group III nitride semiconductor light-emitting device, with suppression of an increase in polarity inversion defect density.

BRIEF DESCRIPTION OF THE DRAWINGS

Various other objects, features, and many of the attendant advantages of the present techniques will be readily appreciated as the same becomes better understood with reference to the following detailed description of the preferred embodiments when considered in connection with the accompanying drawings, in which.

DETAILED DESCRIPTION OF PREFERRED EMBODIMENTS

A specific embodiment of the semiconductor light-emitting device and the production method therefor will next be described, with reference to the drawings. However, the embodiment should not be construed as limiting the techniques thereto. The layer structure of the below-described semiconductor light-emitting device and the electrode configuration thereof are merely examples, and a layer structure other than that of the embodiment may also be employed. The thickness of each of the layers shown in the drawings is a conceptual thickness, which is not an actual thickness.

1. Semiconductor Light-Emitting Device

Figure 1:
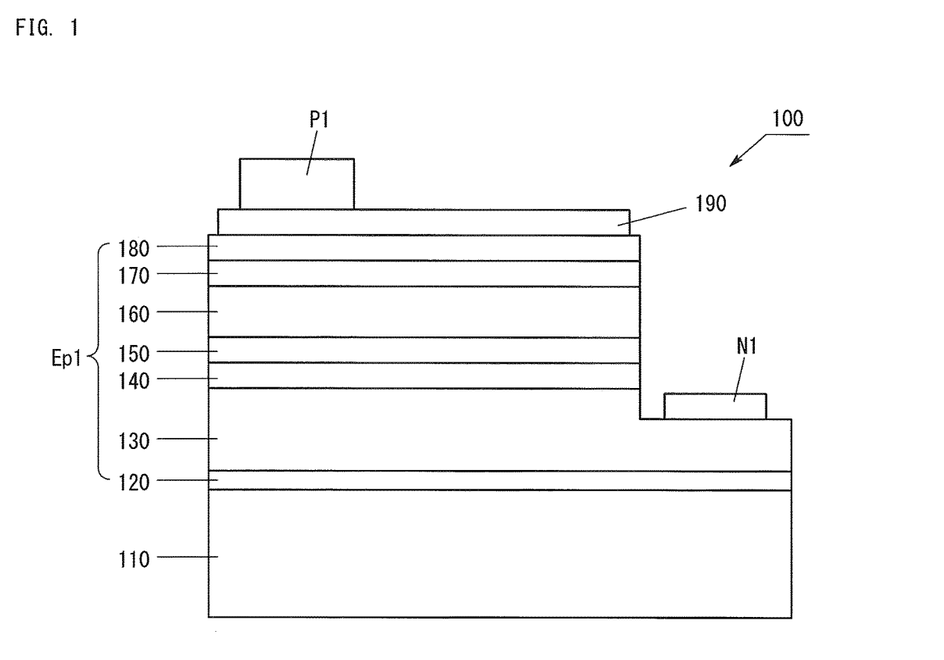
FIG. 1 is a schematic view of a Group III nitride semiconductor light-emitting device according to an embodiment.

FIG. 1 shows a general structure of a light-emitting device 100 according to the embodiment. The light-emitting device 100 is a face-up type semiconductor light-emitting device. The light-emitting device 100 has semiconductor layers Ep1 composed of a plurality of Group III nitride semiconductor layers.

As shown in FIG. 1, the light-emitting device 100 has a substrate 110, the semiconductor layer Ep1, a transparent electrode 190, an n-electrode N1, and a p-electrode P1. The semiconductor layer Ep1 includes a low-temperature buffer layer 120, an n-type contact layer 130, an n-type high breakdown voltage layer 140, an n-type cladding layer 150, a light-emitting layer 160, a p-type cladding layer 170, and a p-type contact layer 180. The n-type contact layer 130, the n-type high breakdown voltage layer 140, and the n-type cladding layer 150 are made of an n-type semiconductor. The p-type cladding layer 170 and the p-type contact layer 180 are made of a p-type semiconductor. The n-type semiconductor layers and the p-type semiconductor layers may include a non-doped semiconductor layer. The light-emitting device 100 may have a protective film for protecting a semiconductor layer Ep1 or the like.

The low-temperature buffer layer 120 is disposed on a main surface of the substrate 110. The low-temperature buffer layer 120 is made of a material such as AlN or GaN. The n-type contact layer 130 is disposed on the low-temperature buffer layer 120. The n-type contact layer 130 is made of a material such as n-type GaN. The n-type high breakdown voltage layer 140 is disposed on the n-type contact layer 130. The n-type high breakdown voltage layer 140 serves as a layer which prevents electrostatic breakdown of the semiconductor layer Ep1. The n-type high breakdown voltage layer 140 is formed of, for example, a deposited structure of a non-doped GaN layer and an n-type GaN layer. The n-type cladding layer 150 is disposed on the n-type high breakdown voltage layer 140. The n-type cladding layer 150 serves as a strain relaxation layer for relaxing the stress applied to the light-emitting layer 160. The n-type cladding layer 150 is a super-lattice layer having a super-lattice structure. The n-type cladding layer 150 is formed of, for example, a super-lattice structure of n-type GaN layers and n-type InGaN layers.

The light-emitting layer 160 is disposed on the n-type cladding layer 150. In the light-emitting layer 160, holes and electrons are recombined to cause light emission. The p-type cladding layer 170 is disposed on the light-emitting layer 160. The p-type cladding layer 170 is a super-lattice layer having a super-lattice structure. The p-type contact layer 180 is disposed on the p-type cladding layer 170.

The transparent electrode 190 is disposed on the p-type contact layer 180. The transparent electrode 190 is preferably made of any material selected from among ITO, IZO, ICO, ZnO, $TiO_2$, $NbTiO_2$, $TaTiO_2$, and $SnO_2$.

The n-electrode N1 is disposed on the n-type contact layer 130. The n-electrode N1 is a deposited structure of an Ni layer and an Au layer, with the Ni layer being in contact with the n-type contact layer 130. The n-electrode N1 may be a deposited structure formed by sequentially depositing V, Al or Ti, and Al. The p-electrode P1 is disposed on the transparent electrode 190. The p-electrode P1 is a deposited structure of an Ni layer and an Au layer, with the Ni layer being in contact with the transparent electrode 190.

2. The Layer Structure in the Vicinity of the p-Type Cladding Layer

2-1. Light-Emitting Layer

Figure 2:
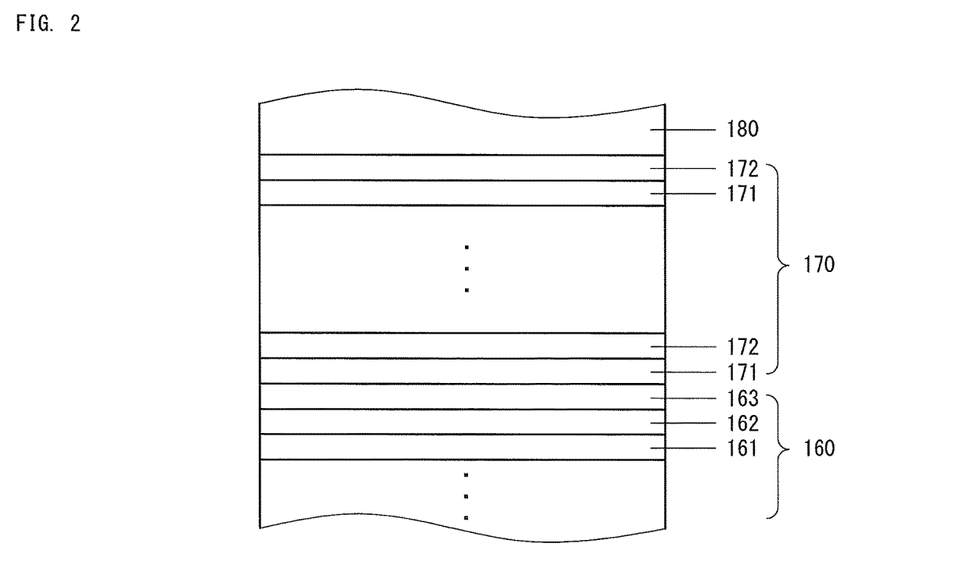
FIG. 2 is a layer structure of the Group III nitride semiconductor light-emitting device according to the embodiment, mainly focused on the p-type cladding layer.

FIG. 2 is a schematic view of a layer structure including the light-emitting layer 160 and the p-type cladding layer 170. In the light-emitting layer 160, holes and electrons are recombined to cause light emission. The light-emitting layer 160 has a multiple quantum well (MQW) structure in which unit layer structures are repeatedly deposited. Each unit layer structure is formed of an InGaN layer 161, a GaN layer 162, and an AlGaN layer 163, which are deposited in this order on the under layer. In one mode, nine unit layer structures are repeatedly deposited. The number of repetition may be varied within the range of 5 to 12. Needless to say, the number of repetition may fall outside the range. Also, the deposit order of the layers in the unit layer structure may be altered. Any unit layer structure, other than the aforementioned one, may also be employed. In such a case, GaN, InGaN, AlGaN, and AlInGaN may be combined at random.

2-2. p-Type Cladding Layer

The p-type cladding layer 170 is disposed on the light-emitting layer 160. The p-type cladding layer 170 is formed by repeatedly depositing a p-type AlGaN layer 171 and a p-type InGaN layer 172. The number of repetition is, for example, five. Each p-type AlGaN layer 171 has an Al content (compositional proportion) of 10% to 40%. The p-type AlGaN layer 171 has a thickness of 5 Å to 70 Å. Each p-type InGaN layer 172 has an In content (compositional proportion) of 2% to 20%. Notably, the In content of the p-type InGaN layer 172 is smaller than that of the InGaN layer 161 of the light-emitting layer 160. The p-type InGaN layer 172 has a thickness of 5 Å to 70 Å. These content and thickness values are merely examples, and other values may be acceptable. The p-type cladding layer may have another layer configuration.

2-3. p-Type Contact Layer

The p-type contact layer 180 is disposed on the p-type cladding layer 170. The p-type contact layer 180 is made of a material such as p-type GaN. The p-type contact layer 180 may have a double-layer structure of two layers having different carrier concentrations.

3. p-Type Cladding Layer Production Step

3-1. Production Step

Figure 3:
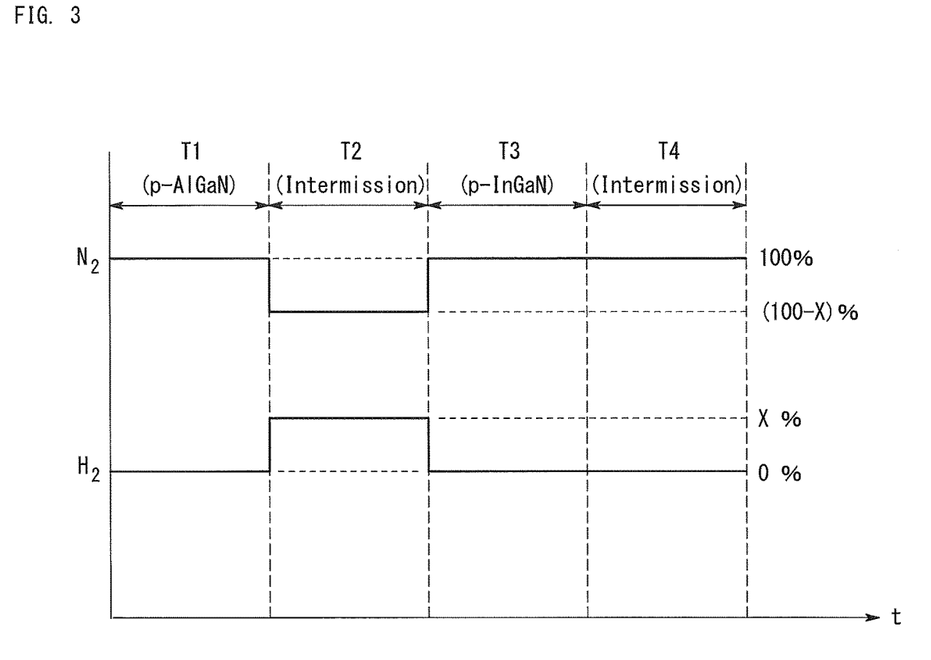
FIG. 3 is a graph describing a p-type cladding layer production step included in the method for producing the Group III nitride semiconductor light-emitting device of the embodiment.

A production step for producing a p-type cladding layer 170 will next be described. FIG. 3 is a graph describing the production step for the p-type cladding layer 170. As shown in FIG. 3, the production step for the p-type cladding layer 170 includes a first p-type semiconductor layer formation step, a first intermission step, a p-type InGaN layer formation step, and a second intermission step.

In the first p-type semiconductor layer formation step, a p-type AlGaN layer 171 is formed. In the first intermission step, semiconductor layer growth is stopped after the first p-type semiconductor layer formation step. In the p-type InGaN layer formation step, a p-type InGaN layer 172 is formed after the first intermission step. In the second intermission step, semiconductor layer growth is stopped after the p-type InGaN layer formation step. After the second intermission step, the first p-type semiconductor layer formation step is carried out, whereby another p-type AlGaN layer 171 and another p-type InGaN layer 172 are repeatedly deposited.

FIG. 3 shows a first film formation phase T1 for forming the p-type AlGaN layer 171, a first intermission phase T2 in which film formation is stopped after formation of the p-type AlGaN layer 171, a second film formation phase T3 for forming the p-type InGaN layer 172, and a second intermission phase T4 in which film formation is stopped after formation of the p-type InGaN layer 172. The first intermission phase T2 is defined as a period of time from termination of formation of the p-type AlGaN layer 171 to initiation of formation of the p-type InGaN layer 172. The second intermission phase T4 is defined as a period of time from termination of formation of the p-type InGaN layer 172 to initiation of formation of the p-type AlGaN layer 171.

As shown in FIG. 3, in the first film formation phase T1, no hydrogen gas is supplied, but nitrogen gas is supplied to the MOCVD furnace. As a result, nitrogen gas is selectively supplied to the substrate 110, without supplying hydrogen gas to the substrate 110. The substrate temperature in the first layer formation phase T1 is 800° C. to 1,050° C.

In the first intermission phase T2, a mixture of nitrogen gas and hydrogen gas is supplied. The gas mixture will be described in detail hereinafter. In the first intermission phase T2, the substrate temperature is lowered from the temperature employed in the first layer formation phase T1 to that of the second layer formation phase T3. Thus, in the first intermission phase T2, a mixture of nitrogen gas and hydrogen gas is supplied, while the substrate temperature is lowered.

In the second layer formation phase T3, nitrogen gas is supplied to the substrate 110, without supplying hydrogen gas to the substrate 110. The substrate temperature in the second film formation phase T3 is 700° C. to 950° C.

In the second intermission phase T4, nitrogen gas is supplied to the substrate 110, without supplying hydrogen gas to the substrate 110. In the second intermission phase T4, the substrate temperature is elevated from the temperature employed in the second film formation phase T3 to that of the first film formation phase T1.

3-2. Gas Mixture Used in the First Intermission Step

In the first intermission step, the ratio X of the volume of hydrogen gas to the total volume of nitrogen gas and hydrogen gas of the gas mixture (hereinafter referred to as "hydrogen gas mixing ratio") is adjusted to 20% to 100%. The hydrogen gas mixing ratio X satisfies the following condition:

$$X = VH_2/(VH_2 + VN_2)$$

$VH_2$: volume of hydrogen gas
$VN_2$: volume of nitrogen gas

The hydrogen gas mixing ratio X is preferably 40% to 95%, more preferably 50% to 80%. The range of hydrogen gas mixing ratio X will be described in detail hereinafter.

3-3. Polarity Inversion Defect Density

When a semiconductor layer is formed through epitaxial growth on a Ga-plane side surface, in some case an N-plane is intermingled with the Group III element-plane. The thus-formed N-plane-incorporated sites are referred to as polarity inversion defects, and the number of polarity inversion defects per unit area is defined as "polarity inversion defect density." The polarity inversion defect density tends to increase as the progress of epitaxial growth. That is, the polarity inversion defect density at the later stage of epitaxial growth is generally higher than that at the initial stage of epitaxial growth.

In this embodiment, a mixture of nitrogen gas and hydrogen gas is supplied to the epitaxial growth layer in the first intermission phase T2. The epitaxial growth layer is etched by supplied hydrogen gas. A portion including polarity inversion defects is more susceptible to etching. That is, in the production method, polarity inversion defects are preferentially etched.

In this embodiment, no hydrogen gas is supplied to the growth chamber in the second intermission phase T4. Thus, etching of the p-type InGaN layer 172 of the p-type cladding layer 170 by hydrogen gas is substantially prevented. As a result, the surface of the p-type InGaN layer 172 is not damaged.

As described above, in the embodiment of the production method, polarity inversion defects are preferentially removed through etching from the surface of the p-type AlGaN layer 171 of the p-type cladding layer 170, whereby rise in polarity inversion defect density can be suppressed. In this embodiment, supply of hydrogen gas is stopped, and then the p-type InGaN layer 172 is formed. As a result, damage of the p-type InGaN layer 172 of the p-type cladding layer 170 by hydrogen gas is prevented.

4. Semiconductor Light-Emitting Device Production Method

Next will be described an embodiment of the method for producing the semiconductor light-emitting device. The production method includes:

forming an n-type semiconductor layer on a substrate, forming a light-emitting layer on the n-type semiconductor layer, and forming a p-type semiconductor layer on the light-emitting layer.

In this production method, semiconductor layers are formed through epitaxial growth on a substrate 110. Epitaxial growth is carried out by metal organic chemical vapor deposition (MOCVD). The carrier gas employed in the method is hydrogen gas ($H_2$), nitrogen gas ($N_2$), or a mixture of hydrogen gas and nitrogen gas ($H_2+N_2$). The nitrogen gas source may be ammonia gas ($NH_3$). The Ga source may be trimethylgallium ($Ga(CH_3)_3$: hereinafter abbreviated as "TMG"). The In source may be trimethylindium ($In(CH_3)_3$: hereinafter abbreviated as "TMI"). The Al source may be trimethylaluminum ($Al(CH_3)_3$: hereinafter abbreviated as "TMA"). Silane ($SiH_4$) may be used as an n-type dopant gas. Cyclopentadienylmagnesium ($Mg(C_5H_5)_2$: hereinafter referred to as "$Cp_2Mg$") may be used as a p-type dopant gas.

4-1. n-Type Semiconductor Layer Formation Step

4-1-1. n-Type Contact Layer Formation Step

Firstly, a low-temperature buffer layer 120 is formed on the substrate 110. An n-type contact layer 130 is formed on the low-temperature buffer layer 120. The substrate temperature is, for example, 1,080° C. to 1,140° C.

4-1-2. n-Type High Breakdown Voltage Layer Formation Step

Subsequently, an n-type high breakdown voltage layer 140 is formed on the n-type contact layer 130. The substrate temperature is, for example, 750° C. to 950° C.

4-1-3. n-Type Cladding Layer Formation Step

Then, an n-type cladding layer 150 is formed on the n-type high breakdown voltage layer 140. The substrate temperature is, for example, 700° C. to 950° C.

4-2. Light-Emitting Layer Formation Step

Next, a light-emitting layer 160 is formed on the n-type cladding layer 150. The light-emitting layer 160 is formed through repeatedly depositing layer structure units, and the number of depositing is described above. The layer structure unit is formed by depositing an InGaN layer, a GaN layer, and an AlGaN layer in this order from the under layer. The InGaN layer is formed at a growth temperature of 750° C. to 800° C. by supplying raw material gases of TMI, TMG, and ammonia. The AlGaN layer is formed at a growth temperature of 850° C. to 950° C. by supplying raw material gases of TMA, TMG, and ammonia.

4-3. p-Type Semiconductor Layer Formation Step

4-3-1. p-Type Cladding Layer Formation Step

On the light-emitting layer 160, a p-type cladding layer 170 is formed. As described above, the first p-type semiconductor layer formation step, the first intermission step, the p-type InGaN layer formation step, and the second intermission step are carried out. In the first p-type semiconductor layer formation step, $CP_2Mg$, TMA, TMG, and ammonia are supplied for forming a p-type AlGaN layer 171.

In the first intermission step, a mixture of nitrogen gas and hydrogen gas is supplied to the substrate 110, while the substrate temperature is lowered. Specifically, supply of hydrogen gas is initiated at the start of the first intermission step, and terminated at the end of the first intermission step. During the first intermission step, the substrate temperature is lowered. Thus, in the first intermission phase T2 of the first intermission step, hydrogen gas is supplied to the growth chamber while the substrate temperature is lowered.

In the p-type InGaN layer formation step, $CP_2Mg$, TMI, TMG, and ammonia are supplied for forming a p-type InGaN layer 172. In second intermission step, nitrogen gas is supplied to the substrate 110 while the substrate temperature is elevated.

4-3-2. p-Type Contact Layer Formation Step

Figure 4:
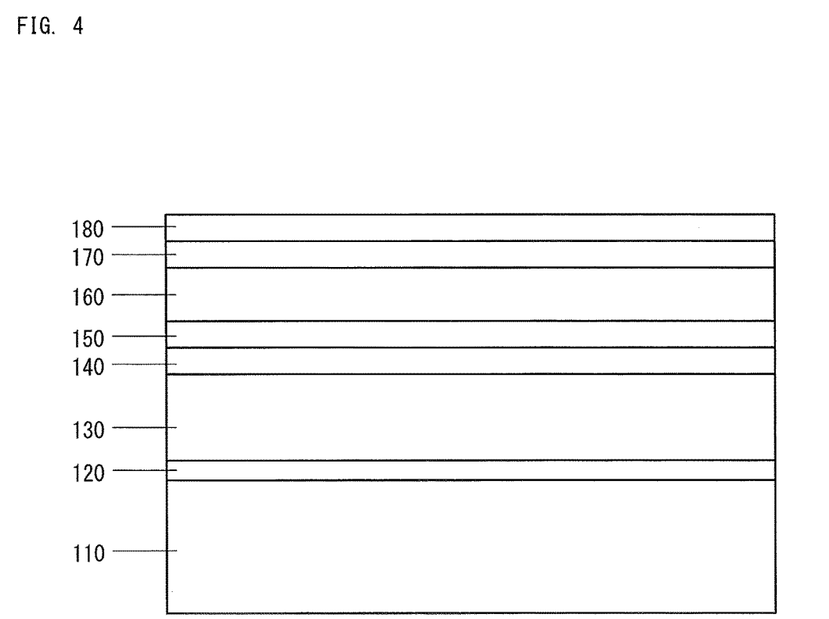
FIG. 4 is a schematic view for describing a production step for the Group III nitride semiconductor light-emitting device according to the embodiment (No. 1)

Subsequently, a p-type contact layer 180 is formed on the p-type cladding layer 170. The substrate temperature is, for example, 900° C. to 1,050° C. FIG. 4 shows the layer structure after formation of the p-type contact layer 180.

4-4. Transparent Electrode Formation Step

Figure 5:
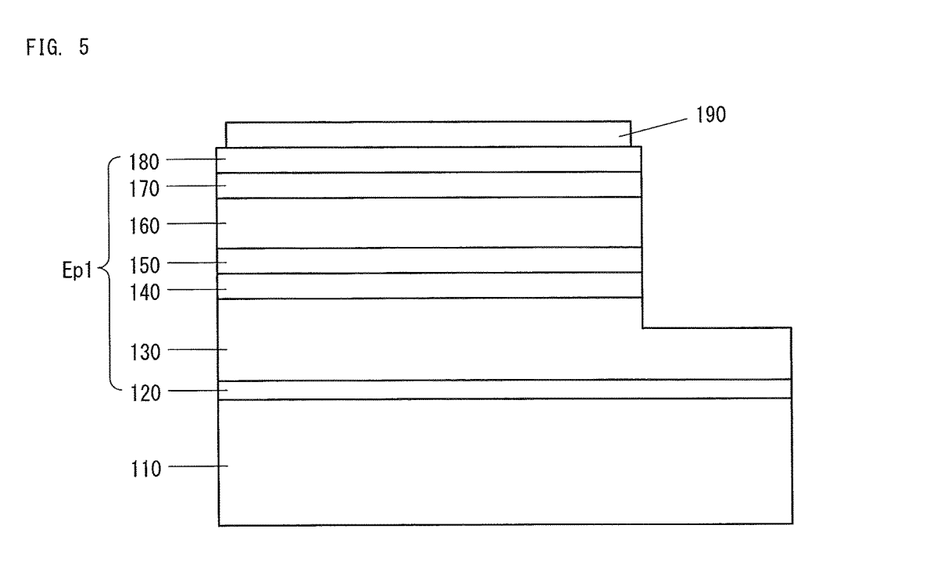
FIG. 5 is a schematic view for describing a production step for the Group III nitride semiconductor light-emitting device according to the embodiment (No. 2)

On the p-type contact layer 180, a transparent electrode 190 is formed through sputtering or a similar technique. The transparent electrode 190 is formed on an area other than an area where an n-electrode N1 is to be formed.

4-5. Electrode Formation Step

Subsequently, the p-type contact layer 180 is dry-etched from the top surface thereof, whereby a groove reaching the intermediate depth of the n-type contact layer 130 is provided. As shown FIG. 5, a part of the n-type contact layer 130 is exposed. On the thus-exposed n-type contact layer 130, the n-electrode N1 is formed. Also, a p-electrode P1 is formed on the transparent electrode 190.

4-6. Device Chipping Step

The substrate 110 on which the semiconductor layers and the electrodes have been provided is cut to individual devices. Device chipping is performed by means of a laser cutting apparatus or a breaking apparatus.

4-7. Other Steps

In addition to the aforementioned steps, there may be further performed a protective film formation step, a thermal treatment step for semiconductor layers, and other steps. Through such steps, the light-emitting device 100 shown in FIG. 1 is produced.

5. Experiments

5-1. Polarity Inversion Defect Density

Some experiments were carried out to assess the formed p-type cladding layer 170. In the first experiment, the p-type cladding layer 170 was formed under variation of the hydrogen mixing ratio X in the first intermission step. At each hydrogen mixing ratio X, polarity inversion defect density was determined. The polarity inversion defect density was measured at the interface between the p-type cladding layer 170 and the p-type contact layer 180. Separately, a light-emitting device 100 was fabricated using the present techniques, and drive voltage was measured.

Figure 6:
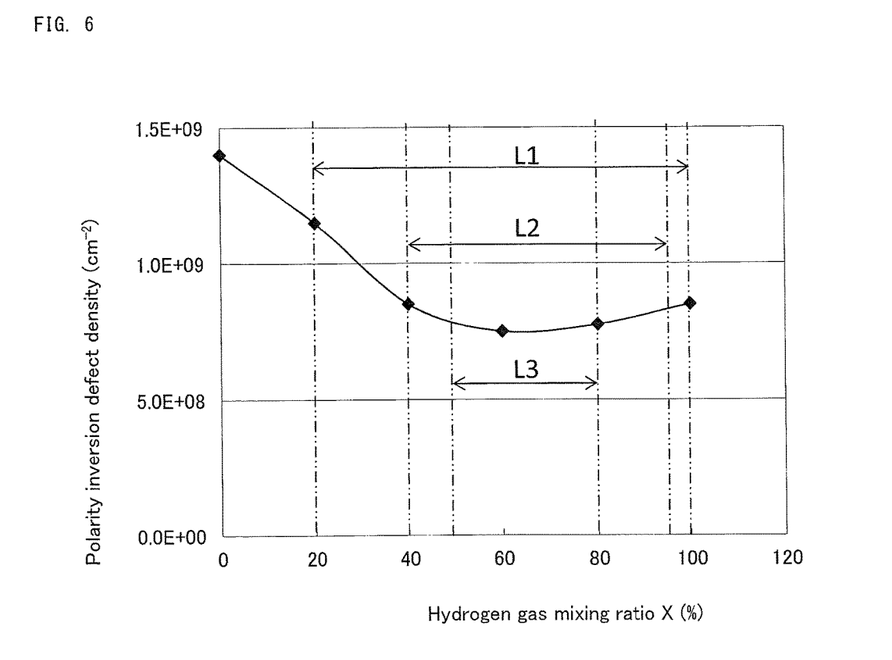
FIG. 6 is a graph showing the relationship between the hydrogen content of the gas mixture supplied in the first intermission phase of the p-type cladding layer formation step and the polarity inversion defect density.

FIG. 6 is a graph showing the relationship between the hydrogen content X and the polarity inversion defect density, under variation of X. In FIG. 6, the horizontal axis represents hydrogen gas mixing ratio X, and the vertical axis represents polarity inversion defect density. As shown in FIG. 6, when hydrogen gas was present in the first intermission phase T2, polarity inversion defect density was low.

Specifically, when the hydrogen gas mixing ratio X was 20% to 100% (denoted by arrow L1 in FIG. 6), the polarity inversion defect density was $1.2\times10^9$ cm$^{-2}$ or lower. When the hydrogen gas mixing ratio X was 40% to 95% (denoted by arrow L2 in FIG. 6), the polarity inversion defect density was $9.0\times10^8$ cm$^{-2}$ or lower. When the hydrogen gas mixing ratio X was 50% to 80% (denoted by arrow L3 in FIG. 6), the polarity inversion defect density was $8.0\times10^8$ cm$^{-2}$ or lower.

As described above, the hydrogen gas mixing ratio X of the gas mixture is preferably 20% to 100%, more preferably 40% to 95%, still more preferably 50% to 80%.

5-2. Drive Voltage

A light-emitting device was fabricated when a mixture of nitrogen gas and hydrogen gas was used in the first intermission step involved in the p-type cladding layer formation step (Example). Another light-emitting device was fabricated when nitrogen gas was used with no hydrogen gas (Comparative Example). The two light-emitting devices were compared with each other in terms of drive voltage.

Figure 7:
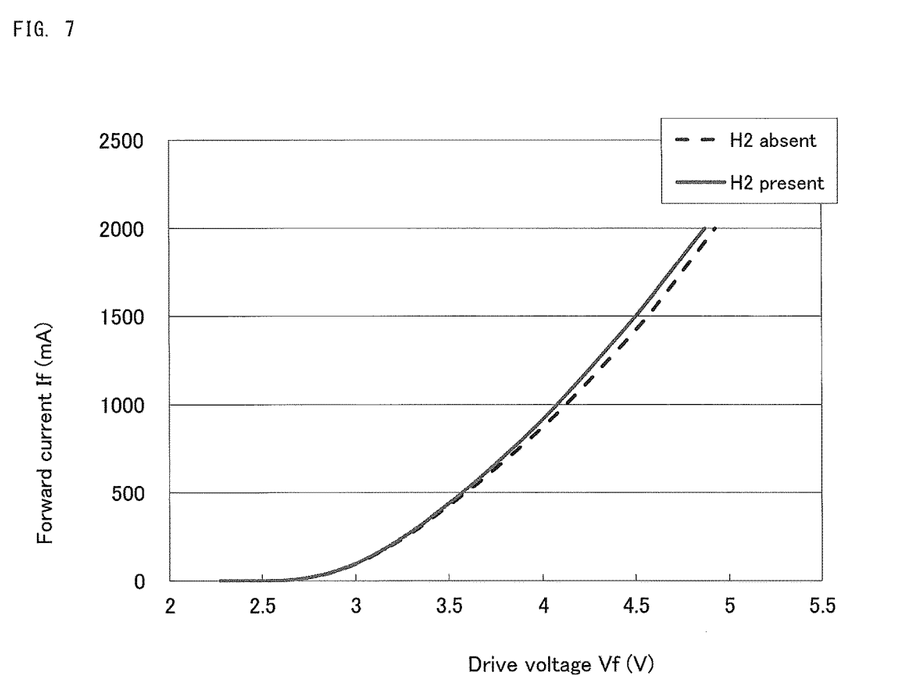
FIG. 7 is a graph showing the relationship between the forward current and the drive voltage, in the presence or absence of hydrogen gas in the gas supplied in the first intermission phase of the p-type cladding layer formation step.

FIG. 7 is a graph showing the relationship between drive voltage Vf and forward current If. As shown in FIG. 7, the light-emitting device fabricated with a mixture of nitrogen gas and hydrogen gas (Example) was found to exhibit a drive voltage lower than that of the light-emitting device fabricated with nitrogen gas (Comparative Example).

More specifically, as shown in TABLE 1, the light-emitting device fabricated with a mixture containing hydrogen gas exhibited a drive voltage of 4.08 V when the forward current If was 1000 mA. The light-emitting device fabricated without supply of hydrogen gas exhibited a drive voltage of 4.13 V when the forward current If was 1000 mA. When the forward current If was 2000 mA, the light-emitting device fabricated with a mixture containing hydrogen gas exhibited a drive voltage of 4.87 V, and the light-emitting device fabricated without supply of hydrogen gas exhibited a drive voltage of 4.93 V.

TABLE 1

| If | Vf (with no hydrogen) | Vf (with hydrogen) |
| --- | --- | --- |
| 1000 mA | 4.13 V | 4.08 V |
| 2000 mA | 4.93 V | 4.87 V |

As is clear from TABLE, the polarity inversion defect density of the p-type AlGaN layer 171 can be reduced through supplying a mixture of nitrogen gas and hydrogen gas during the first intermission phase T2. Thus, the polarity inversion defect density of a subsequently grown semiconductor layer becomes lower than that of a similar layer employed in a conventional semiconductor light-emitting device. The drive voltage Vf of the light-emitting device 100 of the above embodiment is low.

6. Modifications

6-1. p-Type Cladding Layer

In the above embodiment, a p-type AlGaN layer 171 is employed in the p-type cladding layer 170. Alternatively, a p-type GaN layer may be employed instead of the p-type AlGaN layer 171.

6-2. Order of Layer Formation in p-Type Cladding Layer

In the above embodiment, the p-type AlGaN layer 171 and the p-type InGaN layer 172 are sequentially formed. Alternatively, the p-type InGaN layer may be formed first. Even in the alternative case, a mixture of hydrogen gas and nitrogen gas is supplied during the intermission phase after formation of the p-type AlGaN layer.

6-3. Gas Mixture

In addition to the aforementioned gas mixture, an additional gas such as ammonia may be supplied during the first intermission step after formation of the p-type cladding layer.

6-4. Combination

The aforementioned modifications may be employed in combination arbitrarily.

7. Summary of the Embodiment

As described hereinabove, in the embodiment of the method for producing a Group III nitride semiconductor light-emitting device, a mixture of hydrogen gas and nitrogen gas is supplied in the first intermission step T2 involved in the p-type cladding layer formation step. Thus, the polarity inversion defects in the surface of the p-type AlGaN layer 171 can be reduced, whereby the light-emitting device 100 ensures low drive voltage Vf.

The above embodiment is merely an example, and the present techniques may encompass various modifications and variations, so long as they fall within the scope of the present techniques. In the above embodiment, metal organic chemical vapor deposition (MOCVD) is employed as an epitaxial growth technique. However, other vapor phase growth techniques such as hydride vapor phase epitaxy (HVPE) may also be employed.

8. Note

In the first intermission step, a mixture of hydrogen gas and nitrogen gas is supplied, while the substrate temperature is lowered. At the initiation of the first intermission step, supply of hydrogen gas is started, and supply of hydrogen is stopped at the termination of the first intermission step.

What is claimed is:

1. A method for producing a Group III nitride semiconductor light-emitting device, the method comprising:
    forming an n-type semiconductor layer on a substrate;
    forming a light-emitting layer on the n-type semiconductor layer;
    forming a p-type cladding layer on the light-emitting layer, and
    forming a p-type contact layer on the p-type cladding layer;
    the forming of the p-type cladding layer comprising:
        forming a first p-type semiconductor layer;
        interrupting a semiconductor layer growth after the forming of the first p-type semiconductor layer; and
        forming a p-type InGaN layer after the interrupting of the semiconductor layer growth,
    wherein the interrupting of the semiconductor layer growth after the forming of the first p-type semiconductor layer comprises, supplying a mixture of nitrogen gas and hydrogen gas to the substrate, and etching at least polarity inversion defects of a surface of the first p-type semiconductor layer.

2. The method for producing a Group III nitride semiconductor light-emitting device according to claim 1, the forming of the p-type cladding layer further comprising:
    interrupting a semiconductor layer growth after the forming of the p-type InGaN layer,
    wherein in the interrupting of the semiconductor layer growth after the forming of the p-type InGaN layer, nitrogen gas is supplied to the substrate, while no hydrogen gas is supplied to the substrate.

3. The method for producing a Group III nitride semiconductor light-emitting device according to claim 2,
    wherein in the forming of the first p-type semiconductor layer and the forming of the p-type InGaN layer, nitrogen gas is supplied to the substrate, while no hydrogen gas is supplied to the substrate.

4. The method for producing a Group III nitride semiconductor light-emitting device according to claim 3,
    wherein the ratio of the volume of hydrogen gas to the total volume of nitrogen gas and hydrogen gas of the gas mixture is adjusted to 20% to 100%, in the interrupting of the semiconductor layer growth after the forming of the first p-type semiconductor layer.

5. The method for producing a Group III nitride semiconductor light-emitting device according to claim 3, the forming of the first p-type semiconductor layer further comprising:
    forming a p-type AlGaN layer or a p-type GaN layer as the first p-type semiconductor layer.

6. The method for producing a Group III nitride semiconductor light-emitting device according to claim 2,
    wherein the ratio of the volume of hydrogen gas to the total volume of nitrogen gas and hydrogen gas of the gas mixture is adjusted to 20% to 100%, in the interrupting of the semiconductor layer growth after the forming of the first p-type semiconductor layer.

7. The method for producing a Group III nitride semiconductor light-emitting device according to claim 2, the forming of the first p-type semiconductor layer further comprising:
    forming a p-type AlGaN layer or a p-type GaN layer as the first p-type semiconductor layer.

8. The method for producing a Group III nitride semiconductor light-emitting device according to claim 2,
    in the interrupting of the semiconductor layer growth after the forming of the first p-type semiconductor layer:
        lowering the substrate temperature;
        starting a supply of hydrogen gas at an initiation of the interrupting of the semiconductor layer growth after the forming of the first p-type semiconductor layer; and
        stopping the supply of hydrogen gas at a termination of the interrupting of the semiconductor layer growth after the forming of the first p-type semiconductor layer.

9. The method for producing a Group III nitride semiconductor light-emitting device according to claim 2,
    wherein the forming of the p-type cladding layer comprises depositing the first p-type semiconductor layer and the p-type InGaN layer repeatedly.

10. The method for producing a Group III nitride semiconductor light-emitting device according to claim 1,
    wherein in the forming of the first p-type semiconductor layer and the forming of the p-type InGaN layer, nitrogen gas is supplied to the substrate, while no hydrogen gas is supplied to the substrate.

11. The method for producing a Group III nitride semiconductor light-emitting device according to claim 10,
    wherein the ratio of the volume of hydrogen gas to the total volume of nitrogen gas and hydrogen gas of the gas mixture is adjusted to 20% to 100%, in the interrupting of the semiconductor layer growth after the forming of the first p-type semiconductor layer.

12. The method for producing a Group III nitride semiconductor light-emitting device according to claim 10, the forming of the first p-type semiconductor layer further comprising:
    forming a p-type AlGaN layer or a p-type GaN layer as the first p-type semiconductor layer.

13. The method for producing a Group III nitride semiconductor light-emitting device according to claim 1,
    wherein the ratio of the volume of hydrogen gas to the total volume of nitrogen gas and hydrogen gas of the gas mixture is adjusted to 20% to 100%, in the interrupting of the semiconductor layer growth after the forming of the first p-type semiconductor layer.

14. The method for producing a Group III nitride semiconductor light-emitting device according to claim 1, the forming of the first p-type semiconductor layer further comprising:
    forming a p-type AlGaN layer or a p-type GaN layer as the first p-type semiconductor layer.

15. The method for producing a Group III nitride semiconductor light-emitting device according to claim 1,
    in the interrupting of the semiconductor layer growth after the forming of the first p-type semiconductor layer:
        lowering the substrate temperature;
        starting a supply of hydrogen gas at an initiation of the interrupting of the semiconductor layer growth after the forming of the first p-type semiconductor layer; and
        stopping the supply of hydrogen gas at a termination of the interrupting of the semiconductor layer growth after the forming of the first p-type semiconductor layer.

16. The method for producing a Group III nitride semiconductor light-emitting device according to claim 1, wherein the forming of the p-type cladding layer comprises depositing the first p-type semiconductor layer and the p-type InGaN layer repeatedly.

17. The method for producing a Group III nitride semiconductor light-emitting device according to claim 1, wherein in the forming of the first p-type semiconductor layer, a temperature of the substrate is in a range from 800° C. to 1,050° C.

18. The method for producing a Group III nitride semiconductor light-emitting device according to claim 1, wherein in the forming of the p-type InGaN layer, a temperature of the substrate is in a range from 700° C. to 950° C.

19. A method for producing a Group III nitride semiconductor light-emitting device, the method comprising:
   forming an n-type semiconductor layer on a substrate;
   forming a light-emitting layer on the n-type semiconductor layer;
   forming a p-type cladding layer on the light-emitting layer, and
   forming a p-type contact layer on the p-type cladding layer;
   wherein the forming of the p-type cladding layer comprises:
      forming a first p-type semiconductor layer;
      interrupting a semiconductor layer growth after the forming of the first p-type semiconductor layer; and
      forming a p-type InGaN layer after the interrupting of the semiconductor layer growth,
   wherein the forming of the first p-type semiconductor layer comprises supplying a nitrogen gas to the substrate,
   wherein the interrupting of the semiconductor layer growth after forming the first p-type semiconductor layer, comprises supplying a mixture of nitrogen gas and hydrogen gas to the substrate, and
   wherein the forming of the p-type cladding layer further comprises:
      switching carrier gas supply in the forming of the first p-type semiconductor layer and in the interrupting of the semiconductor layer growth after the forming of the first p-type semiconductor layer.

* * * * *